United States Patent

Vidovic

[15] 3,657,559

[45] Apr. 18, 1972

[54] FREQUENCY DEPENDENT ZERO PHASE SHIFT

[72] Inventor: Nikola Vidovic, Auburn, Calif.

[73] Assignee: The Singer Company, New York, N.Y.

[22] Filed: Apr. 27, 1971

[21] Appl. No.: 137,752

[52] U.S. Cl. .................................307/230, 307/229, 330/16
[51] Int. Cl. .........................................................G06g 7/12
[58] Field of Search.....................330/16, 69, 30 D; 307/229, 307/230

[56] References Cited

UNITED STATES PATENTS 3,569,739 3/1971 Stolman.............................307/229 X

*Primary Examiner*—Donald D. Forrer
*Assistant Examiner*—B. P. Davis
*Attorney*—Francis L. Masselle, William Grobman and Charles S. McGuire

[57] ABSTRACT

An amplifier providing a frequency dependent gain with no phase shift which is particularly useful in television aperture correction is shown. Generally a frequency dependent input to and feed back around an operational amplifier provide the frequency dependent gain and a transistor circuit with an RC circuit having the same time constant as the feed back circuit, in its emitter path assures zero phase shift.

6 Claims, 2 Drawing Figures

Nikola Vidovic
INVENTOR.

BY

Charles S. McGuire
ATTORNEY

FREQUENCY DEPENDENT ZERO PHASE SHIFT

This invention relates to amplifiers in general and more particularly to an amplifier useful for aperture correction in a television camera.

Aperture correction in television cameras is useful to compensate for the blurring caused by the finite size of the scanning spot. Providing the proper type of correction without phase shift will increase the resolution of the camera.

An approximate form of the correction required is well known in the art and takes the form $G(j\omega) = G(o)(1+\omega^2 T^2)$. For example see the *Television Engineering Handbook* by Donald Fink pp,11-39 and 11-40 McGraw Hill, 1957) and *Horizontal Aperture Equalization* by A. N. Thiele in The Radio and Electronic Engineer, Vol 40, No. 4, Oct. 1970.

The normal way of providing this correction has been to use delay lines. The present invention shows how the same results may be obtained without delay lines, using instead a simple amplifier circuit.

It is the principle object of this invention to provide a circuit having frequency dependent gain with no phase shift.

It is also the object to provide such a circuit useful in television aperture correction.

Another object is to provide such a circuit without using delay lines.

A further object is to provide such a circuit having means to adjust high frequency peaking.

Other objects of the invention will in part be obvious and will in part appear hereinafter.

The invention accordingly comprises the features of construction, combination of elements, and arrangements of parts, which will be exemplified in the construction hereinafter set forth, and the scope of the invention will be indicated in the claims.

For a fuller understanding of the nature and objects of the invention reference should be had to the following detailed description taken in connection with the accompanying drawings, in which.

As indicated in the above references the required frequency response is that approximating the inverse Gaussian exp $(\omega^2 T^2)$. The transfer function $G(j\omega) = G(o)(1+\omega^2 T^2)$ represents the most significant terms of a power series expansion of that exponential and will give adequate correction.

Figure 1:
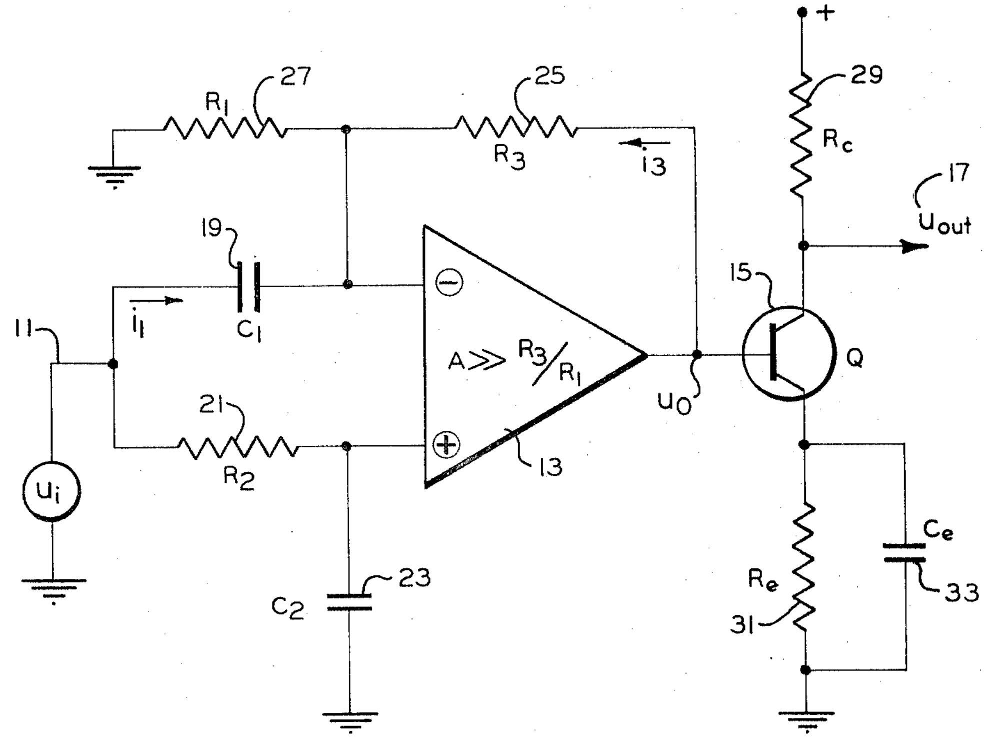
FIG. 1 is a circuit diagram of a preferred embodiment of the circuit.

FIG. 1 shows the circuit of the present invention. The input video is provided on line 11 to amplifier 13 through a network of resistors and capacitors. The output of amplifier 13 is the input to transistor 15 which provides the final circuit output on line 17.

The input on line 11 is connected to a capacitor 19($C_1$) and a resistor 21 ($R_2$). Capacitor 19 is connected to the inverting input of amplifier 13 and resistor 21 is connected to the non-inverting input of amplifier 13. Also connected to this non-inverting input of amplifier 13. Also connected to this non-inverting input is a capacitor 23 ($C_2$) with its other end connected to ground. The output of amplifier 13 is connected through feed back resistor 25 ($R_3$) to the inverting input of amplifier 13. Also connected to this inverting input is a resistor 27($R_1$) with its other end connected to ground.

The output of amplifier 13 is applied as a control signal to the base of transistor 15. Transistor 15 has its collector connected to a positive voltage source through resistor 29 (Rc) and its emitter connected to ground through a resistor 31 (Re) and capacitor 33 (Ce) in parallel. The output 17 is taken off at the collector of transistor 15.

In general terms, frequency dependent feed back through the networks described above and the frequency dependent characteristics of the input circuits cause amplifier 13 to have a gain characteristic of the type desired. The circuit of transistor 15 comprising resistor 31 and capacitor 33 restores any phase shift introduced to give a resulting frequency dependent zero phase shift output.

An analysis of the circuits involved will show that the proper transfer function is obtained. If the amplifier gain A is assumed to be much greater than $R_3/R_1$ (which is normally the case), a set of equations may be written as follows:

$$(1 + j\omega R_1 C_1) i_1 + j\omega C_1 R_1 i_3 + O = j\omega C_1 u_i \qquad (1)$$

$$R_1 i_1 + (R_1 + R_3) i_{3-u_0} = O \qquad (2)$$

$$R_1 i_1 + R_1 i_3 + \frac{u_0}{A} = \frac{u_i}{1 + j\omega R_2 C_3} \qquad (3)$$

$$u_{out} = \frac{R_c}{R_e}(1 + j\omega R_e C_e) u_0 \qquad (4)$$

By proper substitution the following equation results:

$$u_{out} = G(j\omega) = \frac{R_c}{R_e} \frac{R_1 + R_3}{R_1} \frac{(1 + \omega^2 C_1 C_2 R_1 R_2 R_3)}{R_1 + R_3} \qquad (5)$$

Where $R_2 C_2 = R_e C_e$

Then if:

$$G(o) = g\frac{R_c}{R_e} \qquad (6)$$

Where $$g = \frac{R_3 + R_1}{R_1}$$

And $$T^2 = R_1 C_1 R_2 C_2 \frac{(g-1)}{g} \qquad (7)$$

which is the proper form for $T^2$, i.e. two $RC$ time constants) the desired result of:

8. $G(j\omega) = G(o)(1+\omega^2 T^2)$ is obtained.

Thus, by making $R_2 C_2$ equal to $R_e C_e$, an amplifier having the proper gain characteristic without phase shift results. The value of $C_1$ or $R_1$ may be made adjustable to change $T^2$ and thus to adjust the high frequency peaking.

Figure 2:
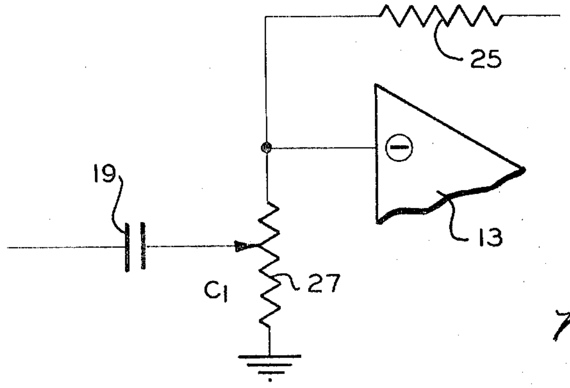
FIG. 2 is a modification to the circuit of FIG. 1 to provide simple adjustment.

FIG. 2 shows a modification to the non-inverting input. Resistor 27 is replaced with a potentiometer and the input on capacitor 19 connected to its wiper. Analysis of such a circuit will show some phase shift. By proper selection of components this shift can be kept in the order of 4° and will not have a serious effect on aperture correction while still allowing easy adjustment.

Thus, a circuit which provides a zero phase shift frequency dependent gain, useful to perform aperture correction without the use of delay lines, has been shown.

What is claimed is:

1. A circuit for providing frequency dependent gain with little or no phase shift comprising:
   a. an operational amplifier;
   b. a first capacitor connected on one side to the inverting input of said amplifier;
   c. a first resistor connected on one side to the non-inverting input of said amplifier and on the other side to the other side of said first capacitor to provide an input to the circuit;
   d. a second capacitor connected on one side to said non-inverting input and on the other side to ground;
   e. a second resistor connected between the inverting input and the output of said amplifier;
   f. a third resistor connected between said inverting input and ground;
   g. a transistor having its base connected to the output of said amplifier and having the circuit output at its collector;
   h. a fourth resistor connected between a positive voltage source and the collector of said transistor; and
   i. a fifth resistor and third capacitor connected in parallel between the emitter of said transistor and ground, the value of said fifth resistor times said third capacitor being equal to the value of said first resistor times said second capacitor.

2. The invention according to claim 1 and further including means for adjusting high frequency peaking.

3. The invention according to claim 2 wherein said means comprises means to vary said first capacitor.

4. The invention according to claim 2 wherein said means comprises means to vary said fourth resistor.

5. The invention according to claim 2 wherein said means comprises making said fourth resistor a potentiometer and connecting said first capacitor to said inverting input through the wiper of said potentiometer.

6. The invention according to claim 1 wherein said circuit is used for television aperture correction.

* * * * *